US012300658B2

United States Patent
Oda et al.

(10) Patent No.: US 12,300,658 B2
(45) Date of Patent: May 13, 2025

(54) COPPER ALLOY BONDING WIRE FOR SEMICONDUCTOR DEVICES

(71) Applicants: NIPPON MICROMETAL CORPORATION, Saitama (JP); NIPPON STEEL Chemical & Material Co., Ltd., Tokyo (JP)

(72) Inventors: Daizo Oda, Saitama (JP); Takashi Yamada, Saitama (JP); Motoki Eto, Saitama (JP); Teruo Haibara, Saitama (JP); Tomohiro Uno, Tokyo (JP)

(73) Assignees: NIPPON MICROMETAL CORPORATION, Saitama (JP); NIPPON STEEL CHEMICAL & MATERIAL CO., LTD., Tokyo (JP)

( * ) Notice: Subject to any disclaimer, the term of this patent is extended or adjusted under 35 U.S.C. 154(b) by 0 days.

(21) Appl. No.: 17/942,838

(22) Filed: Sep. 12, 2022

(65) Prior Publication Data
US 2023/0018430 A1 Jan. 19, 2023

Related U.S. Application Data

(63) Continuation of application No. 16/311,125, filed as application No. PCT/JP2017/021825 on Jun. 13, 2017, now abandoned.

(30) Foreign Application Priority Data

Jun. 20, 2016 (JP) .................................. 2016-121807
Sep. 27, 2016 (WO) ................... PCT/JP2016/078485

(51) Int. Cl.
| | |
|---|---|
| *C22C 9/04* | (2006.01) |
| *B23K 35/02* | (2006.01) |
| *B23K 35/30* | (2006.01) |
| *C22C 9/06* | (2006.01) |
| *H01L 23/00* | (2006.01) |

(52) U.S. Cl.
CPC .......... *H01L 24/45* (2013.01); *B23K 35/0227* (2013.01); *B23K 35/302* (2013.01); *C22C 9/04* (2013.01); *C22C 9/06* (2013.01); *H01L 2224/45105* (2013.01); *H01L 2224/45109* (2013.01); *H01L 2224/45118* (2013.01); *H01L 2224/45123* (2013.01); *H01L 2224/45139* (2013.01); *H01L 2224/45144* (2013.01); *H01L 2224/45147* (2013.01); *H01L 2224/45155* (2013.01); *H01L 2224/45164* (2013.01); *H01L 2224/45166* (2013.01); *H01L 2224/45169* (2013.01); *H01L 2224/45173* (2013.01); *H01L 2224/45178* (2013.01); *H01L 2924/01005* (2013.01); *H01L 2924/01012* (2013.01); *H01L 2924/01015* (2013.01); *H01L 2924/0102* (2013.01); *H01L 2924/01022* (2013.01); *H01L 2924/01028* (2013.01); *H01L 2924/01029* (2013.01); *H01L 2924/0103* (2013.01); *H01L 2924/01031* (2013.01); *H01L 2924/01032* (2013.01); *H01L 2924/01033* (2013.01); *H01L 2924/01034* (2013.01); *H01L 2924/01045* (2013.01); *H01L 2924/01046* (2013.01); *H01L 2924/01047* (2013.01); *H01L 2924/01049* (2013.01); *H01L 2924/01052* (2013.01); *H01L 2924/01057* (2013.01); *H01L 2924/01077* (2013.01); *H01L 2924/01078* (2013.01); *H01L 2924/01079* (2013.01)

(58) Field of Classification Search
CPC .......................... B23K 35/0227; B23K 35/302
See application file for complete search history.

(56) References Cited

U.S. PATENT DOCUMENTS

| | | | |
|---|---|---|---|
| 4,822,560 | A | 4/1989 | Oyama et al. |
| 9,427,830 | B2 | 8/2016 | Uno et al. |
| 9,597,754 | B2 | 3/2017 | Kanou |
| 2007/0062619 | A1 | 3/2007 | Maehara et al. |
| 2008/0061440 | A1 | 3/2008 | Uno et al. |
| 2012/0094121 | A1 | 4/2012 | Uno et al. |
| 2012/0263624 | A1 | 10/2012 | Chiba et al. |

(Continued)

FOREIGN PATENT DOCUMENTS

| | | |
|---|---|---|
| CN | 102459668 A | 5/2012 |
| CN | 103137236 A | 6/2013 |

(Continued)

OTHER PUBLICATIONS

Uno, T. "Bond reliability under humid environment for coated copper wire and bare copper wire." 2011. Microelectronics reliability. 51. p. 148-156. (Year: 2011).*
Chinese Office Action issued in corresponding Chinese Patent Application No. 201780037612.X, dated May 27, 2019, with English translation.
Korean Office Action issued in corresponding Korean Patent Application No. 10-2018-7036864, dated May 20, 2019, with English translation.
Office Action issued in corresponding Taiwan Patent Application No. 110128915 dated Sep. 5, 2022, w/ English translation.

(Continued)

*Primary Examiner* — Nicholas A Wang
(74) *Attorney, Agent, or Firm* — Rimon P.C.

(57) ABSTRACT

In a copper alloy bonding wire for semiconductor devices, the bonding longevity of a ball bonded part under high-temperature and high-humidity environments is improved. The copper alloy bonding wire for semiconductor devices includes in total 0.03% by mass or more to 3% by mass or less of at least one or more kinds of elements selected from Ni, Zn, Ga, Ge, Rh, In, Ir, and Pt (first element), with the balance Cu and inevitable impurities. The inclusion of a predetermined amount of the first element suppresses production of an intermetallic compound susceptible to corrosion under high-temperature and high-humidity environments at the wire bonding interface and improves bonding longevity of a ball bonded part.

3 Claims, No Drawings

(56) References Cited

U.S. PATENT DOCUMENTS

| | | |
|---|---|---|
| 2013/0140084 A1 | 6/2013 | Sarangapani et al. |
| 2013/0142568 A1* | 6/2013 | Sarangapani ........ B23K 35/302 420/495 |
| 2014/0010705 A1 | 1/2014 | Kanou |
| 2015/0360316 A1 | 12/2015 | Milke et al. |
| 2015/0360879 A1 | 12/2015 | Kanaris |
| 2015/0371726 A1 | 12/2015 | Inoue et al. |
| 2016/0078980 A1 | 3/2016 | Sarangapani et al. |
| 2017/0040281 A1 | 2/2017 | Oyamada et al. |
| 2017/0110430 A1 | 4/2017 | Oyamada et al. |
| 2017/0200690 A1 | 7/2017 | Yamada et al. |

FOREIGN PATENT DOCUMENTS

| | | |
|---|---|---|
| CN | 103137237 A | 6/2013 |
| CN | 103155130 A | 6/2013 |
| CN | 103295993 A | 9/2013 |
| CN | 103715111 A | 4/2014 |
| CN | 104018023 A | 9/2014 |
| CN | 104995322 A | 10/2015 |
| CN | 105390463 A | 3/2016 |
| CN | 105405828 A | 3/2016 |
| CN | 105492637 A | 4/2016 |
| CN | 105518165 A | 4/2016 |
| DE | 3104960 A1 | 8/1982 |
| DE | 3916168 A1 | 11/1989 |
| EP | 3042972 A1 | 7/2016 |
| GB | 2093064 A | 8/1982 |
| GB | 2220956 A | 1/1990 |
| JP | S61-20693 A | 1/1986 |
| JP | 61-048543 A | 3/1986 |
| JP | S6148543 * | 3/1986 |
| JP | S61163194 * | 7/1986 |
| JP | S-61163194 A | 7/1986 |
| JP | S61-234556 A | 10/1986 |
| JP | H04-184946 A | 7/1992 |
| JP | H07-70674 A | 3/1995 |
| JP | H07-138679 A | 5/1995 |
| JP | H-09256084 A | 9/1997 |
| JP | 11-121673 A | 4/1999 |
| JP | 2000-273560 A | 10/2000 |
| JP | 2008-085319 A | 4/2008 |
| JP | 2008-085320 A | 4/2008 |
| JP | WO2010150814 * | 12/2010 |
| JP | 2014-075458 A | 4/2014 |
| JP | 2014075458 * | 4/2014 |
| JP | 2015-002213 A | 1/2015 |
| JP | 5893230 B1 | 3/2016 |
| JP | 5912008 B1 | 4/2016 |
| JP | 2016-517623 A | 6/2016 |
| KR | 10-2012-0031005 A | 3/2012 |
| KR | 10-2013-0122325 A | 11/2013 |
| SG | 2013038336 A | 5/2014 |
| SG | 10201403091 U | 1/2015 |
| TW | 201107499 A | 3/2011 |
| TW | 201241194 A | 10/2012 |
| TW | 201314806 A | 4/2013 |
| TW | 201411748 A | 3/2014 |
| TW | 201415566 A | 4/2014 |
| TW | 201602366 A | 1/2016 |
| WO | 2010/150814 A1 | 12/2010 |
| WO | 2015/163297 A1 | 10/2015 |
| WO | 2016/203659 A1 | 12/2016 |
| WO | 2016/203899 A1 | 12/2016 |
| WO | 2017/013796 A1 | 1/2017 |

OTHER PUBLICATIONS

German Office Action issued in corresponding German Patent Application No. 112017008353.2, dated Nov. 30, 2021, with Engiish translation.

Japanese Office Action issued in corresponding Japanese Patent Application No. 2019-071623, dated Jan. 4, 2022, with Engiish translation.

Non-Final Office Action issued in U.S. Appl. No. 16/311,125, dated Sep. 8, 2020.

Final Office Action issued in U.S. Appl. No. 16/311,125, dated Dec. 16, 2020.

Non-Final Office Action issued in U.S. Appl. No. 16/311,125, dated Aug. 23, 2021.

Final Office Action issued in U.S. Appl. No. 16/311,125, dated Nov. 26, 2021.

Non-Final Office Action issued in U.S. Appl. No. 16/311,125, dated May 12, 2022.

German Office Action issued in corresponding German Patent Application No. 11 2017 003 058.7, dated Dec. 6, 2019, with English translation.

Japanese Office Action issued in corresponding Japanese Patent Application No. 2018-523933, dated Jul. 10, 2018, with English Translation.

Japanese Decision to Grant a Patent issued in corresponding Japanese Patent Application No. 2018-523933, dated Oct. 9, 2018, with English Translation.

International Search Report issued in corresponding International Patent Application No. PCT/JP2017/021825, dated Sep. 19, 2017, with English Translation.

Office Action issued in corresponding Japanese Patent Application No. 2021-124400, mailed Nov. 1, 2022, w/ English translation.

Singaporean Office Action issued in corresponding Singapore Patent Application No. 10202002650X, dated Sep. 14, 2020, with English translation.

Korean Office Action issued in corresponding Korean Patent Application No. 10-2019-7032506, dated Nov. 29, 1 2019, with English translation.

Japanese Office Action issued in corresponding Japanese Patent Application No. 2019-071623, dated Jun. 1, 2021, with English translation.

Taiwanese Office Action issued in corresponding Taiwanese Patent Application No. 106120320, dated Jun. 19, 2019.

Taiwanese Office Action issued in corresponding Taiwanese Patent Application No. 109142768, dated Feb. 3, 2021, with English translation.

Office Action issued in corresponding Chinese Patent Application No. 202110066731.6, dated Oct. 31, 2023 w/ English MT.

Office Action dated Sep. 20, 2024, from Taiwanese patent application No. 110128915 (non-English).

Office Action issued in the corresponding Taiwanese Patent Application No. 110128915 on Mar. 25, 2025.

* cited by examiner

COPPER ALLOY BONDING WIRE FOR SEMICONDUCTOR DEVICES

CROSS-REFERENCE TO RELATED APPLICATIONS

This application is a continuation of U.S. application Ser. No. 16/311,125, which was filed on Dec. 18, 2018, which is the U.S. National Phase under 35 U.S.C. § 371 of International Application No. PCT/JP2017/021825, filed on Jun. 13, 2017, which claims the benefit of Japanese Application No. 2016-121807, filed on Jun. 20, 2016 and International Application No. PCT/JP2016/078485, filed Sep. 27, 2016, the entire contents of each are hereby incorporated by reference.

TECHNICAL FIELD

The present invention relates to a copper alloy bonding wire for semiconductor devices for connecting electrodes on semiconductor devices with wiring of printed circuit boards, such as external leads.

BACKGROUND ART

Fine wire approximately 15 to 50 µm in diameter is now mainly used as a bonding wire for semiconductor devices (hereinafter referred to as "bonding wire"), for bonding the electrodes on a semiconductor device with external leads. A method for bonding the bonding wire with the electrodes on a semiconductor device is generally a thermal compressive bonding technique with the aid of ultrasound, which uses a general-purpose bonder, a capillary tool used for bonding by passing the bonding wire therethrough, and the like. The bonding process of a bonding wire is carried by heating and melting a tip end of wire by arc heat input to form a ball (FAB: Free Air Ball) under surface tension; compression-bonding the ball part onto an electrode on a semiconductor device heated within a range of 150 to 300° C. (hereinafter referred to as "ball bonding"); forming a loop; and finally compression-bonding the wire to an electrode on the external lead side (hereinafter referred to as "wedge bonding"). For example, an electrode structure formed by depositing an Al-based alloy on a Si substrate is used as the electrode on the semiconductor device to which a bonding wire is bonded, and an electrode structure plated with Ag or Pd is used as the electrode on the external lead side.

Gold (Au) has been the common material of bonding wires but has been increasingly replaced with copper (Cu) particularly in the LSI applications. Meanwhile, with the recent proliferation of electric vehicles and hybrid vehicles, there has been a growing demand for replacement of Au with Cu in the vehicle-mounted device applications.

The copper bonding wire including high-purity Cu (purity: 99.99% by mass or more) has been proposed (for example, Patent Literature 1). When a copper bonding wire is used, bonding reliability and loop stability in high-density packing are also required. Bonding reliability is evaluated for the purpose of evaluating a bonding longevity in the actual use environment of semiconductor devices. Bonding reliability is usually evaluated by a high-temperature exposure test and a high-temperature and high-humidity test. A common high-temperature and high-humidity test is a test called pressure cooker test (PCT) performed under the conditions: temperature of 121° C. and relative humidity of 100%.

Patent Literature 2 describes a copper alloy bonding wire for semiconductor applications, including a copper alloy containing Pd in a concentration range of 0.13 to 1.15% by mass. The addition of Pd in the concentration range above can improve the high-humidity heating reliability in the PCT test.

RELATED ART REFERENCE

Patent Literature

Patent Literature 1: JP-A-S61-48543
Patent Literature 2: WO2010/150814

SUMMARY OF INVENTION

Problem to be Solved by the Invention

Vehicle-mounted devices require bonding reliability under severer high-temperature and high-humidity environments, compared with general electronic devices. In particular, the bonding longevity of a ball bonded part in which the ball part of the wire is bonded to the electrode is the biggest issue. There have been proposed several methods of evaluating bonding reliability under high-temperature and high-humidity environments, and a typical method recently used is a highly accelerated temperature and humidity stress test (HAST) (high-temperature and high-humidity environment exposure test). HAST is characterized in that humidity absorbed in the evaluation package is uniform and the reproducibility of the evaluation result is high. When the bonding reliability of the ball bonded part is evaluated by HAST, the ball bonded part to be evaluated is exposed in a high-temperature and high-humidity environment with temperature of 130° C. and relative humidity of 85%, and the bonding longevity of the ball bonded part is evaluated by measuring change over time in a resistance value of the bond and measuring change over time in shear strength of the ball bond. By applying bias voltage, evaluation stricter than PCT is also possible. The bonding longevity of 100 hours or longer in HAST under such conditions has recently been required.

An object of the present invention is to provide a bonding wire for semiconductor devices, suitable for vehicle-mounted devices, by improving the bonding reliability of the ball bonded part in high-temperature and high-humidity environments in the bonding wire. Specifically, the present invention is based on the finding of added elements suited for a copper alloy bonding wire having sufficient bonding reliability and suitable addition concentrations thereof, even in HAST with application of bias voltage, which is a severer evaluation method.

Means for Solving Problem

That is, the summary of the present invention is as follows.

(1) A copper alloy bonding wire for semiconductor devices, comprising in total 0.03% by mass or more to 3% by mass or less of at least one or more kinds of elements selected from Ni, Zn, Ga, Ge, Rh, In, Ir, and Pt, with the balance comprising Cu and inevitable impurities.

(2) The copper alloy bonding wire for semiconductor devices according to (1), wherein an average crystal grain size (µm) in core cross section in a direction vertical to a wire axis of the copper alloy bonding wire is $$0.02 \times R + 0.4 \text{ or more} \tag{1a}$$

$$0.1 \times R + 0.5 \text{ or less} \tag{1b}$$

where R (µm) is a diameter of the wire.

(3) The copper alloy bonding wire for semiconductor devices according to (1) or (2), wherein an average film thickness of copper oxide on a surface of the wire is in a range of 0.0005 to 0.02 μm.
(4) The copper alloy bonding wire for semiconductor devices according to any one of (1) to (3), wherein the copper alloy bonding wire further comprises 0.0001 to 0.050% by mass of each of at least one or more kinds of elements selected from Ti, B, P, Mg, Ca, La, As, Te, and Se, with respect to the entire wire.
(5) The copper alloy bonding wire for semiconductor devices according to any one of (1) to (4), wherein the copper alloy bonding wire further comprises in total 0.0005 to 0.5% by mass of at least one or more kinds of elements selected from Ag and Au, with respect to the entire wire.
(6) The copper alloy bonding wire for semiconductor devices according to any one of (1) to (5), wherein the copper alloy bonding wire further comprises 1.15% by mass or less of Pd.
(7) The copper alloy bonding wire for semiconductor devices according to any one of (1) to (6), wherein the copper alloy bonding wire comprises two or more kinds of elements selected from Ni, Zn, Ga, Ge, Rh, In, Ir, and Pt.

Effect of the Invention

According to the present invention, the inclusion of in total 0.03% by mass or more to 3% by mass or less of at least one or more kinds of elements selected from Ni, Zn, Ga, Ge, Rh, In, Ir, and Pt in a copper alloy bonding wire for semiconductor devices improves the bonding longevity of a ball bonded part under high-temperature and high-humidity environments and improves the bonding reliability.

EMBODIMENT FOR CARRYING OUT THE INVENTION

<First Element and Effect Thereof>

A copper alloy bonding wire for semiconductor devices (hereinafter simply referred to as "bonding wire") according to the present invention is formed by drawing a copper alloy including in total 0.03% by mass or more to 3% by mass or less of at least one or more kinds of elements (also referred to as "first element") selected from Ni, Zn, Ga, Ge, Rh, In, Ir, and Pt with the balance Cu and inevitable impurities. The bonding wire in the present invention is an alloy based on copper and may be called "copper alloy bonding wire". The copper alloy bonding wire for semiconductor devices in the present invention is a bonding wire that does not have a coating layer based on a metal other than copper and may be called "bare Cu alloy wire". The bonding wire in the present invention can improve the bonding reliability of the ball bonded part in high-temperature and high-humidity environments as requested by vehicle-mounted devices.

The molding resin (epoxy resin) serving as a package of a semiconductor device has chlorine (Cl) in its molecular framework. Under the high-temperature and high-humidity environment at 130° C. and a relative humidity of 85% as the HAST evaluation conditions, Cl in the molecular framework is hydrolyzed and eluted as chloride ions (Cl$^-$). When the copper alloy bonding wire is bonded to an Al electrode, Cu and Al mutually diffuse in the Cu/Al bond interface under high temperature, resulting in an intermetallic compound $Cu_9Al_4$. $Cu_9Al_4$ is susceptible to corrosion by halogen such as Cl, and Cl eluted from the molding resin accelerates the corrosion, leading to reduction in bonding reliability. Thus, in a conventional copper alloy bonding wire, the bonding longevity of ball bonded part is not sufficient in the HAST evaluation.

By contrast, as in the present invention, when a copper alloy bonding wire includes in total 0.03% by mass or more of the first element (at least one or more kinds of elements selected from Ni, Zn, Ga, Ge, Rh, In, Ir, and Pt), the bonding longevity of the ball bonded part is improved in the HAST evaluation for the ball bonded part using the copper alloy bonding wire. The inclusion of in total 0.03% by mass or more of the first element may be likely to suppress production of $Cu_9Al_4$ intermetallic compound at the bond. Presumably, the first element present at the Cu-Al interface in the ball bonded part increases the effect of suppressing interdiffusion of Cu and Al and consequently suppresses production of $Cu_9Al_4$ susceptible to corrosion under high-temperature and high-humidity environments. The first element included in the wire may be effective in directly inhibiting the formation of $Cu_9Al_4$. The first element in the vicinity of the bonding interface serves as the barrier function of inhibiting move of halogen that induces corrosion and the function of controlling interdiffusion of Cu and Al and the growth of intermetallic compound.

A ball was formed using the copper alloy bonding wire including a predetermined amount of the first element, and the FAB was observed with a scanning electron microscope (SEM). A large number of deposits approximately a few tens of nanometers in diameter were found on the surface of the FAB. The analysis with an energy dispersive X-ray spectroscopy (EDS) showed that the first element was concentrated. Based on the situation described above, although the mechanism detail is not clear, the presence of the deposits observed on the FAB at the bonding interface between the ball and the electrode seems to significantly improve the bonding reliability of the ball bonded part under the high-temperature and high-humidity environment with temperature of 130° C. and relative humidity of 85%. The bonding wire in the present invention can achieve a satisfactory result also in the PCT evaluation, as is clear from the satisfactory result in the HAST evaluation with severer conditions than the PCT evaluation.

In view of improving the bonding longevity of the ball bonded part under the high-temperature and high-humidity environment with temperature of 130° C. and relative humidity of 85% and improving the bonding reliability, the first element content (also referred to as "concentration") in the wire is in total 0.03% by mass or more, preferably 0.050% by mass or more, more preferably 0.070% by mass or more, further preferably 0.090% by mass or more, 0.100% by mass or more, 0.150% by mass or more, or 0.200% by mass or more. The concentration of in total 0.100% by mass or more of the first element in the wire can meet the severer requirements of bonding reliability.

In view of achieving a satisfactory FAB shape and in view of suppressing increase in hardness of the bonding wire and achieving a satisfactory wedge bondability, the concentration of the first element in the wire is in total 3% by mass or less, preferably 2.5% by mass or less, more preferably 2.0% by mass or less, further preferably 1.9% by mass or less, or 1.5% by mass or less. By defining the upper limit of the first element content as described above, the initial bonding strength with the Al electrode in low-temperature bonding is good, and a satisfactory result can be achieved in view of providing a bonding wire excellent in the longtime reliability in the HAST testing and the process margin in bonding to boards and tapes such as ball grid array (BGA) and chip size package (CSP), and in view of reducing chip damage. If the first element content exceeds 3.0% by mass, it is necessary to perform ball bonding under low load so as not to cause chip damage, which may reduce the initial bonding strength with the electrode and consequently deteriorate the HAST test reliability. In the bonding wire in the present invention, the reliability in the HAST test is further improved by setting the total first element content (concentration) in the preferable range above. For example, the life of the bonding wire until a failure occurs in the HAST test can exceed 250 hours. This may be equivalent to 1.5 times longer than the life of conventional Cu bonding wire and enables the usage in severe environments.

In view of producing a copper alloy bonding wire remarkably excellent in the bonding longevity of the ball bonded part under the high-temperature and high-humidity environment with temperature of 130° C. and relative humidity of 85%, the Cu alloy bonding wire for semiconductor devices in the present invention preferably includes two or more kinds of elements (first element) selected from Ni, Zn, Ga, Ge, Rh, In, Ir, and Pt. Among those, preferable examples of the combination of first elements are: Ni and Zn; Ni and Ga; Ni and Ge; Ni and In; Pt and Zn; Pt and Ga; Pt and Ge; Pt and In; Ir and Zn; Ir and Ge; Rh and Ga; Rh and In; Ni, Pt, and Zn; Ni, Pt, and Ga; Ni, Pt, and Ge; Ni, Pt, and In; Pt, Ir, and Zn; Pt, Ir, and Ga; Ir, Rh, and Ge; and Ir, Rh, and In.

<Average Grain Size of Bonding Wire>

The effects of crystal grain size in the bonding wire on the wire quality were evaluated. It has been found that the average crystal grain size in core cross section in a direction vertical to the wire axis of the bonding wire has a preferable range, and when the average crystal grain size (μm) is $$0.02 \times R + 0.4 \text{ or more} \tag{1a}$$

$$0.1 \times R + 0.5 \text{ or less} \tag{1b}$$

where R (μm) is the wire diameter, the crushed shape of the ball bonded part and the wedge bondability are satisfactory.

In measuring the crystal grain size, it is preferable to use an electron backscattered diffraction (EBSD). The grain size can be determined using analysis software installed in the device for the measurement result by the EBSD method. The crystal grain size defined in the present invention is the arithmetic mean of the equivalent diameters of crystal grains included in the measurement region (the diameter of a circle equivalent to the area of the crystal grain).

<Average Film Thickness of Copper Oxide on Wire Surface>

In the present invention, the average film thickness of copper oxide on the wire surface is preferably in a range of 0.0005 to 0.02 μm. In the copper alloy bonding wire including the first element in the concentration range of in total 0.03 to 3% by mass, the average film thickness of copper oxide on the wire surface in the range of 0.0005 to 0.02 μm can further increase the effect of stably improving the HAST reliability in mass production level. If the film thickness of copper oxide on the wire surface is larger than 0.02 μm, the effect of improving HAST reliability in the ball bonded part of the bonding wire made of a copper alloy including the first element tends to vary and the bonding strength and the like after HAST heating tends to be unstable. The variation in HAST reliability may be more significant with bonding wire with a wire diameter of 20 μm or less. The reason why copper oxide on the surface of the copper alloy including the first element makes the HAST reliability unstable may be, although there are still unclear points, that the concentration distribution of the first element is uneven in the longitudinal direction of the copper alloy bonding wire or in the depth direction from the wire surface or that oxygen intrusion inside the ball or the residual oxide may inhibit the effect of improving the HAST reliability by the first element. In the copper alloy bonding wire including the first element, since surface oxidation can be delayed, the average film thickness of copper oxide can be controlled in a thin range of 0.0005 to 0.02 μm. It has also been confirmed that the copper alloy bonding wire including the first element in the concentration range of in total 0.03 to 3% by mass has the effect of delaying the growth of the copper oxide film on the wire surface in a low temperature range of about 20 to 40° C., compared with high-purity copper.

If the average film thickness of copper oxide on the wire surface exceeds 0.02 μm, the effect of improving HAST evaluation tends to vary, as previously mentioned. For example, if the number of bonds to be evaluated is increased, it is more likely that the improving effect varies and becomes unstable. It is therefore preferable that the upper limit of the average film thickness of copper oxide on the wire surface is 0.02 μm. In view of reducing variation of the improving effect, the average film thickness of copper oxide on the wire surface is preferably 0.02 μm or less, more preferably 0.015 μm or less, further preferably 0.013 μm or less. On the other hand, stably keeping the average film thickness of copper oxide on the wire surface at less than 0.0005 μm requires special surface treatment and product control and may induce reduction in bonding characteristics and cost increase to make industrial adaptation difficult. It is therefore preferable that the lower limit of the average film thickness of copper oxide on the wire surface is 0.0005 μm. For example, if a coating film of rust preventive on the wire surface is increased for the purpose of keeping the average film thickness of copper oxide at less than 0.0005 μm, the bonding strength is reduced and the continuous bonding capability is reduced. It may be industrially unacceptable if the guaranteed life of the wire product stored in the atmosphere is extremely reduced for the purpose of keeping the average film thickness of copper oxide at less than 0.0005 μm, because if so, operation in the mass production process of wire bonding is difficult, causing scrap. In view of providing industrially suitable bonding wire, the average film thickness of copper oxide on the wire surface is preferably 0.0005 μm or more, more preferably 0.0008 μm or more, further preferably 0.001 μm or more.

For the measurement of the average film thickness of copper oxide on the wire surface, Auger spectroscopy suitable for surface analysis is effective, and it is preferable to use the average value of the film thicknesses of copper oxide measured at at least three or more points, if possible, five or more points at random positions on the wire surface. Oxygen concentration refers to the ratio of the O concentration to the total concentration of Cu, O, and metal elements. Since organic substances that are typical contamination of the wire surface are excluded, the amount of C is not included in the concentration calculation above. It is preferable to calculate the thickness of a copper oxide film using a value of equivalent $SiO_2$ thickness, which is generally used in Auger spectroscopy, because accurately determining the absolute value of the film thickness of copper oxide is difficult. In the present invention, the oxygen concentration of 30% by mass is set as the boundary between copper oxide and metal copper. Major known copper oxides are $Cu_2O$ and CuO, out of which $Cu_2O$ is often formed first at low temperatures (25 to 500° C.) on the surface of a copper alloy including the first element. For this reason, the oxygen concentration of 30% by mass is set as the boundary.

<Second Element and Effect Thereof>

The bonding wire in the present invention preferably further includes 0.0001 to 0.050% by mass of each of at least one or more kinds of elements (also referred to as "second element") selected from Ti, B, P, Mg, Ca, La, As, Te, and Se with respect to the entire wire. This inclusion improves the crushed shape of the ball bonded part as requested by high-density packaging, that is, the circularity of the ball bounded part can be improved. A better ball shape thus can be achieved. In view of improving the effect of achieving the circularity of the compression bonding shape of the ball bonded part, the second element content (concentration) is preferably in total 0.0001% by mass or more, more preferably 0.0002% by mass or more, further preferably 0.0003% by mass or more. In view of suppressing increase in hardness of the ball and suppressing chip damage during ball bonding, the second element content is preferably 0.050% by mass or less, more preferably 0.045% by mass or less, further preferably 0.040% by mass or less. It is more preferable that each of the second elements is included in the amount of 0.0005% by mass or more because if so, defects in the wedge bond can be reduced. The addition of the second element can increase the effect of reducing work hardening when the wire is deformed and promoting wire deformation at the wedge bond. Although the detailed mechanism is unknown, the first element is soluble in Cu and the second element has a low solubility in Cu and thus deposits and segregates. These elements thus act complementarily to achieve a remarkable effect on wire deformation at the wedge bond.

<Third Element and Effect Thereof>

It is preferable that the bonding wire in the present invention further includes in total 0.0005 to 0.5% by mass of at least one or more kinds of elements (also referred to as "third element") selected from Ag and Au. In the narrow-pitch connection as requested by recent high-density packaging, the deformation shape of the ball bonded part is important, and it is requested to suppress odd shapes such as a petal shape and eccentricity and achieve the circularity. The addition of the third element in combination with the first element increases the effect of facilitating isotropy in ball deformation and increases the circularity of the compression bonding shape. It has been confirmed that the bonding wire is sufficiently adapted to narrow pitch connection of 50 μm or less. This effect is more effectively achieved if the third element content is in total 0.0005 mass or more. In view of improving the effect of increasing the circularity of the compression bonding shape of the ball bonded part, the third element content is preferably in total 0.0005% by mass or more, more preferably 0.0007% by mass or more, further preferably 0.001% by mass or more. In view of forming a satisfactory FAB shape, the third element content is preferably 0.5% by mass or less, more preferably 0.4% by mass or less, further preferably 0.3% by mass or less. On the other hand, if the third element content exceeds 0.5% by mass in total, the FAB shape may be deteriorated. The inclusion of Au in the bonding wire increases the recrystallization temperature and prevents dynamic recrystallization during wire drawing, so that the work structure is uniform and the crystal grain size after heat treatment is relatively uniform. The breaking elongation of the wire is thus improved, and stable wire loops can be formed during bonding. When Au is additionally included, the amount contained is preferably determined such that the total of the first elements in the wire exceeds 0.1% by mass. The bonding wire in the present invention may further include the third element together with the second element or may include the third element in place of the second element.

<Inclusion of Pd and Effect Thereof>

The bonding wire in the present invention preferably further includes Pd in a range of 1.15% by mass or less. This inclusion can further improve the high-humidity heating reliability of the ball bond. When Pd is included in the bonding wire in the concentration range above, Pd may diffuse or concentrate to the bonding interface to affect the interdiffusion of Cu and Al, thereby delaying the corrosion reaction of the Cu-Al intermetallic compound grown on the bonding interface of the ball bonded part. In view of remarkably increasing the HAST reliability, the Pd content is preferably 1.15% by mass or less, more preferably 1.0% by mass or less, further preferably 0.9% by mass or less. On the other hand, if the Pd concentration exceeds 1.15% by mass, the loop shape may vary and the wedge bondability may be reduced because of increase in the room-temperature strength and the high-temperature strength of the wire. It is therefore preferable that the upper limit of the Pd content is 1.15% by mass. The bonding wire in the present invention may include Pd together with the second element and/or the third element or may include Pd in place of one or both of the second element and the third element.

<Method of Manufacturing Bonding Wire>

An overview of the method of manufacturing the bonding wire for semiconductor devices in the present invention will be described.

A copper alloy including an additional element at a necessary concentration is produced by melting using high-purity copper with a copper purity of 4N to 6N (99.99 to 99.9999% by mass). An arc furnace, a high frequency furnace, a resistance furnace, etc. can be used for melting. In order to prevent inclusion of gas such as $O_2$ and $H_2$ in the air, the melting is preferably performed in a vacuum atmosphere or an inert atmosphere such as Ar and $N_2$. Subsequently, the melt is cooled slowly in the furnace to yield an ingot (solid metal casting). The ingot surface is washed with acid and water and then dried. Inductively coupled plasma (ICP) analysis may be effective for the analysis of the concentration of the additional element in copper.

This alloying includes a method of directly adding a high-purity component and a method of using a mother alloy containing additional element at a high concentration of about 1%. The method of using a mother alloy is effective for adding a low concentration and making element distribution uniform. In the added components in the present invention, when a relatively high concentration 0.5% by mass or more of the first element is included, the high-purity direct addition can be employed. In order to stably include a low concentration of the first element and the second element, the method of adding a mother alloy is effective.

In adding the first element, the second element, the third element, and other elements in the bonding wire, instead of the method of adding elements during melting as described above, the alloy element may be attached to the bonding wire surface. This method can achieve the effect of the present invention as described above.

During the wire manufacturing process, an alloy component may be attached to the wire surface. In this case, this process may be introduced in any process in the wire manufacturing process or may be performed multiple times or may be introduced in a plurality of processes. An attaching method can be selected from (1) application of aqueous solution, drying, and then heat treatment, (2) plating (wet), and (3) vapor deposition (dry).

A produced copper alloy mass is first processed into a larger diameter by rolling and then thinned to a final wire diameter by wire drawing. In the rolling process, for example, groove-shaped rolls or swaging is used. In the wire drawing process, a continuous wire drawing machine is used in which a plurality of diamond-coated dies can be set. If necessary, heat treatment is performed during the processing or in the final wire diameter.

When the copper alloy bonding wire includes the first element, the material strength (hardness) of the wire is increased. Therefore, in wire drawing of bonding wire, the area reduction ratio in wire drawing has been as low as 5 to 8%. In the heat treatment after wire drawing, heat temperature has been performed at temperature of 700° C. or higher, because of the high hardness, in order to soften the wire to the level usable as a bonding wire. Because of the high heat treatment temperature, the average crystal grain size (μm) in core cross section exceeds $(0.1 \times R+0.5)$ (where R is the wire diameter (μm)), and the wedge bondability is slightly reduced. On the other hand, if the heat treatment temperature is reduced, the average crystal grain size (μm) in core cross section is less than $(0.02 \times R+0.4)$, and consequently, the crushed shape of the ball bonded part is slightly deteriorated.

Then, in the present invention, it is preferable that the area reduction ratio is set to 10% or more in at least half of all the dies in wire drawing using dies, and the heat treatment temperature in heat treatment after wire drawing is set to a low temperature of 600° C. or lower. As a result, the average crystal grain size (μm) in core cross section in the direction vertical to the wire axis of the bonding wire falls within a preferable range ($0.02 \times R+0.4$ or more, $0.1 \times R+0.5$ or less) (where R is the wire diameter (μm)). The latest wire drawing technique is applied, the lubricant is designed such that the concentration of nonionic surfactant included in the lubricant is higher than the conventional one, the die shape is designed such that the approach angle of the die is gentler than the conventional one, and the cooling water temperature for the dies is set lower than conventional. The synergy of these settings enables wire drawing with an area reduction ratio of 10% or more in spite of increased hardness by inclusion of in total 0.03% by mass or more of the first element in the copper alloy bonding wire.

As the production condition for controlling the average film thickness of copper oxide on the wire surface in the range of 0.0005 to 0.02 μm in the mass production level, it is preferable to suppress oxidation in the wire manufacturing process. In order to control the formation of copper oxide in the heat treatment process, it is effective to control, for example, temperature (200 to 850° C.), the flow rate (1 to 8 L/min) of inert gas in the heat treatment process, and the oxygen concentration in the furnace. It is effective to regulate the oxygen concentration such that the range of concentration measured in the center of the furnace is 0.1 to 6% by volume. The oxygen concentration can be maintained in the range above, for example, by keeping the proper gas flow rate and preventing intrusion of the external air into the heat treatment furnace by modifying the shape of the entrance and the exit of the furnace. Furthermore, in the mass production level, controlling the wire drawing is also desirable. For example, it is effective to actively remove the moisture on the wire surface by drying (blowing hot air at 40 to 60° C.) before winding the wire after one pass in the wire drawing process in water and to control the humidity in storage during the manufacturing process (relative humidity of 60% or less in storage for two days or longer).

EXAMPLES

In the following, the bonding wire according to embodiments of the present invention will be specifically described with Examples.

(Samples)

First of all, the method of preparing a sample will be described. Cu having a purity of 99.99% by mass or more (in the present example, 6N (the one with a concentration of 99.9999% by mass or more was used)) with the balance inevitable impurities was used as the raw material of core. The first element, the second element, the third element, and Pd having a purity of 99% by mass or more with the balance inevitable impurities were used. In order to achieve the composition of wire or core as intended, additional elements to the core, that is, alloy elements including the first element, the second element, the third element, and Pd are prepared. Although the elements may be prepared singly, a Cu mother alloy including an additional element may be produced in advance and then prepared so as to achieve the desired amount of addition, if the element alone has a high melting point or the amount of addition is extremely small.

The copper alloy was produced by continuous casting so as to have a wire diameter of a few millimeters. The resultant alloy of a few millimeters was drawn to yield wire having a diameter of 0.3 to 1.4 mm. In the wire drawing, a commercially available lubricant was used, and the wire drawing rate was 20 to 150 m/min. Except for some examples, acid washing with hydrochloric acid or the like was performed to remove an oxide film on the wire surface. Subsequently, wire drawing was performed using dies, in which at least half of all the dies had an area reduction ratio of 10 to 21%, and in the meantime, heat treatment at 200 to 600° C. was performed once to three times, achieving a diameter of 20 μm or a diameter of 18 μm. After the processing, heat treatment was performed such that the final breaking elongation was about 5 to 15%. The heat treatment was performed by continuously sweeping the wire and supplying $N_2$ or Ar gas. The wire feeding speed was 10 to 90 m/min, the heat treatment temperature was 350 to 600° C., and the heat treatment time was 1 to 10 seconds. As for the production process in Examples 6, 10, 11, 23, 55, 56, 62, and 77, the heat treatment temperature in Examples 11 and 56 was low, 300° C. or lower, and the heat treatment temperature in Examples 6, 10, 55, 62, and 77 was high, 700° C. or higher.

(Method of Evaluation)

[Element Content]

The alloy element contents in the wire were analyzed using an ICP optical emission spectrometer.

[Crystal Grain Size]

The crystal grain size was determined by the EBSD method. For analysis of EBSD measurement data, dedicated software (for example, OIM Analysis manufactured by TSL Solutions) was used. The crystal grain size is the arithmetic mean of equivalent diameters (the diameter of a circle equivalent to the area of the crystal grain) of crystal grains included in the measurement region.

[Average Film Thickness of Copper Oxide]

In the measurement of the average film thickness of copper oxide on the wire surface, depth analysis by Auger spectroscopy was performed, and the average value of the film thicknesses of copper oxide measured at at least three points or more at random positions on the wire surface was used. With sputtering by Ar ions, the measurement was performed in the depth direction, and the unit of the depth is that of equivalent $SiO_2$ thickness. The oxygen concentration of 30% by mass is set as the boundary between copper oxide and metal copper. As used herein the oxygen concentration is the ratio of the oxygen concentration to the total concentration of Cu, oxygen, and metal elements. In measurement, SAM-670 (type FE manufactured by PHI Inc.) was used, and the measurement was conducted with acceleration voltage of electron beams of 5 kV, the measurement region of 10 nA, the acceleration voltage of Ar ion sputtering of 3 kV, and the sputtering rate of 11 nm/min. The measurement results of average film thickness of the copper oxide are provided in the column "Copper oxide average film thickness" in each table.

[HAST]

Samples for bonding reliability evaluation were produced and subjected to HAST evaluation, and the bonding reliability of the ball bonded part under high-temperature and high-humidity environment or high-temperature environment was determined by the bonding longevity of the ball bonded part. The sample for bonding reliability evaluation was produced by performing ball bonding using a commercially available wire bonder on electrodes formed by depositing an Al-1.0% Si-0.5% Cu alloy with a thickness of 0.8 μm on a Si substrate on a common metal frame, followed by encapsulation with a commercially available epoxy resin. The balls were formed while $N_2$+5% $H_2$ gas was supplied at a flow rate of 0.4 to 0.6 L/min, and their size was in the range of 33 to 34 μm in diameter.

For the HAST evaluation, an unsaturated pressure cooker was used, and the produced sample for bonding reliability evaluation was exposed under high-temperature and high-humidity environment with temperature of 130° C. and relative humidity of 85%, and 7 V bias was applied. A shear test was conducted on the ball bonded part every 48 hours, and the time when the value of shear strength was ½ of the initially obtained shear strength was determined as the bonding longevity of the ball bonded part. The shear test after the high-temperature and high-humidity test was performed by removing the resin by acid treatment to expose the ball bonded part.

A tester manufactured by DAGE was used as a shear tester in HAST evaluation. The value of shear strength is the average value of the values measured at 10 points in the ball bonded part selected at random. In the evaluation above, the bonding longevity being less than 96 hours was determined to be practically unacceptable to be marked with a symbol of "cross", being 96 hours to less than 144 hours was determined to be practicable but with some problem to be marked with a symbol of "triangle", being 144 hours to less than 192 hours was determined to be practically acceptable to be marked with a symbol of "circle", being 192 hours or longer was determined to be excellent to be marked with a symbol of "double circle" in the column "HAST" in each table. Only the symbol "cross" indicates fail and the other symbols indicate pass.

[FAB Shape]

In the evaluation of ball formability (FAB shape) in the ball, the balls before bonding were taken and observed, and the presence/absence of voids on the ball surface and the presence/absence of deformation of the ball, which should be spherical, were determined. If any one of them occurred, the sample was determined as fail. The balls were formed by blowing $N_2$ gas at a flow rate of 0.5 L/min in order to suppress oxidation in the melting process. The diameter of the ball was 1.7 times as large as the wire diameter. For one condition, 50 balls were observed. An SEM was used for observation. In the evaluation of the ball formability, a case in which five or more failures occurred was determined to be problematic to be marked with a symbol of "cross", a case of three or four failures was determined to be practicable but somewhat problematic to be marked with a symbol of "triangle", a case of one or two failures was determined to be no problem to be marked with a symbol of "circle", and a case in which no failure occurred was determined to be excellent to be marked with a symbol of "double circle" in the column "FAB shape" in each table. Only the symbol "cross" indicates fail and the other symbols indicate pass.

[Wedge Bondability]

The wedge bondability in the wire bonded part was evaluated by bonding 1000 wires to leads of a lead frame and determined by the frequency of separation of the bonds. The lead frame used was an Fe-42 at % Ni alloy lead frame with 1 to 3 μm Ag plated. In this evaluation, considering a condition severer than usual, the stage temperature was set to 150° C., lower than the typical setting temperature range. In the evaluation above, a case in which 11 or more failures occured was determined to be unacceptable to be marked with a symbol of "cross", a case 6 to 10 failures was determined to be practicable but with some problem to be marked with a symbol of "triangle", a case of 1 to 5 failures was determined to be acceptable to be marked with a symbol of "circle", a case of no failure was determined to be excellent to be marked with a symbol of "double circle" in the column "Wedge bondability" in each table. Only the symbol "cross" indicates fail and the other symbols indicate pass.

[Crushed Shape]

In the evaluation of the crushed shape of the ball bonded part, the ball bonded part was observed from immediately above after bonding and its circularity was determined. For a bonding counterpart, an electrode in which an Al-0.5% Cu alloy was formed as a film with a thickness of 1.0 μm on a Si substrate was used. An optical microscope was used for observation, and 200 points were observed for one condition. Being elliptic with large deviation from a perfect circle and being anisotropic in deformation were determined to be faulty in the crushed shape of the ball bonded part. In the evaluation above, a case in which 6 or more failures occured was determined to be unacceptable to be marked with a symbol of "cross", a case of 4 to 5 failures was determined to be practicable but with some problem to be marked with a symbol of "triangle", a case of 1 to 3 failures was determined to be acceptable to be marked with a symbol of "circle", a case in which a favorable circle was obtained for all was determined to be especially excellent to be marked with a symbol of "double circle" in the column" Crushed shape" in each table.

TABLE 1

| | Ingredient content(% by mass) | | | | | | | | | | |
|---|---|---|---|---|---|---|---|---|---|---|---|
| | First element | | | | | | | | | Second | Third | |
| Example | Ni | Pt | Ir | Rh | Zn | Ga | Ge | In | Total | element | element | Pd |
| 1 | 0.05 | | | | | | | | 0.05 | | | |
| 2 | | 0.04 | | | | | | | 0.04 | | | |
| 3 | | | 0.03 | | | | | | 0.03 | | | |
| 4 | | | | | 0.05 | | | | 0.05 | | | |

TABLE 1-continued

| Example | Ni | Pt | Ir | Rh | Zn | Ga | Ge | In | Total |
|---|---|---|---|---|---|---|---|---|---|
| 5 | | | | | | 0.03 | | | 0.03 |
| 6 | | | | | | | 0.05 | | 0.05 |
| 7 | 0.8 | | | | | | | | 0.8 |
| 8 | | 0.8 | | | | | | | 0.8 |
| 9 | | | 0.9 | | | | | | 0.9 |
| 10 | | | | 1.0 | | | | | 1.0 |
| 11 | | | | | 0.8 | | | | 0.8 |
| 12 | | | | | | 0.9 | | | 0.9 |
| 13 | | | | | | | 0.8 | | 0.8 |
| 14 | | | | | | | | 0.8 | 0.8 |
| 15 | 2.8 | | | | | | | | 2.8 |
| 16 | | 2.9 | | | | | | | 2.9 |
| 17 | | | 2.8 | | | | | | 2.8 |
| 18 | | | | 2.7 | | | | | 2.7 |
| 19 | | | | | 2.9 | | | | 2.9 |
| 20 | | | | | | 3.0 | | | 3.0 |
| 21 | | | | | | | 2.8 | | 2.8 |
| 22 | | | | | | | | 2.7 | 2.7 |

| Example | Crystal grain size (μm) | Average film thickness of copper oxide (μm) | Diameter of wire (μm) | Evaluation result HAST | FAB shape | Crushed shape | Wedge bondability |
|---|---|---|---|---|---|---|---|
| 1 | 1.4 | 0.007 | 20 | Δ | ◉ | ○ | ◉ |
| 2 | 1.5 | 0.003 | 20 | Δ | ◉ | ○ | ◉ |
| 3 | 1.4 | 0.005 | 20 | Δ | ◉ | ○ | ◉ |
| 4 | 1.0 | 0.013 | 20 | Δ | ◉ | ○ | ◉ |
| 5 | 1.1 | 0.010 | 20 | Δ | ◉ | ○ | ◉ |
| 6 | 2.6 | 0.009 | 20 | Δ | ◉ | Δ | ◉ |
| 7 | 1.0 | 0.004 | 20 | ○ | ◉ | ○ | ◉ |
| 8 | 1.1 | 0.0005 | 20 | ○ | ◉ | ○ | ◉ |
| 9 | 1.2 | 0.0006 | 20 | ○ | ◉ | ○ | ◉ |
| 10 | 2.7 | 0.008 | 20 | ○ | ◉ | Δ | ◉ |
| 11 | 0.5 | 0.009 | 20 | ○ | ◉ | ○ | Δ |
| 12 | 1.1 | 0.008 | 20 | ○ | ◉ | ○ | ◉ |
| 13 | 1.2 | 0.008 | 20 | ○ | ◉ | ○ | ◉ |
| 14 | 1.2 | 0.007 | 20 | ○ | ◉ | ○ | ◉ |
| 15 | 1.1 | 0.007 | 20 | ◉ | Δ | ○ | Δ |
| 16 | 1.1 | 0.0008 | 20 | ◉ | Δ | ○ | Δ |
| 17 | 1.0 | 0.006 | 20 | ◉ | Δ | ○ | Δ |
| 18 | 1.2 | 0.003 | 20 | ◉ | Δ | ○ | Δ |
| 19 | 1.1 | 0.007 | 20 | ◉ | Δ | ○ | Δ |
| 20 | 1.1 | 0.006 | 20 | ◉ | Δ | ○ | Δ |
| 21 | 1.0 | 0.003 | 20 | ◉ | Δ | ○ | Δ |
| 22 | 1.2 | 0.010 | 20 | ◉ | Δ | ○ | Δ |

TABLE 2

| | Ingredient content(% by mass) | | | | | | | | | | | |
|---|---|---|---|---|---|---|---|---|---|---|---|---|
| | First element | | | | | | | | | Second element | Third element | Pd |
| Example | Ni | Pt | Ir | Rh | Zn | Ga | Ge | In | Total | | | |
| 23 | | 0.03 | | | | | 0.02 | | 0.05 | | | |
| 24 | 0.4 | | | 0.5 | | | | | 0.9 | | | |
| 25 | 0.3 | | | | 0.5 | | | | 0.8 | | | |
| 26 | 0.3 | | | | | 0.6 | | | 0.9 | | | |
| 27 | 0.3 | | | | | | | 0.5 | 0.8 | | | |
| 28 | | 0.3 | | 0.5 | | | | | 0.8 | | | |
| 29 | | 0.4 | | | 0.5 | | | | 0.9 | | | |
| 30 | | 0.3 | | | | 0.5 | | | 0.8 | | | |
| 31 | | 0.3 | | | | | | 0.4 | 0.7 | | | |
| 32 | | | 0.3 | 0.5 | | | | | 0.8 | | | |
| 33 | | | 0.3 | | 0.5 | | | | 0.8 | | | |
| 34 | | | 0.3 | | | 0.6 | | | 0.9 | | | |
| 35 | | | 0.3 | | | | | 0.5 | 0.8 | | | |
| 36 | 0.2 | 0.2 | | | 0.6 | | | | 1.0 | | | |
| 37 | 0.2 | 0.2 | | | | 0.5 | | | 0.9 | | | |
| 38 | 0.2 | 0.2 | | | | | 0.5 | | 0.9 | | | |
| 39 | 0.2 | 0.2 | | | | | | 0.5 | 0.9 | | | |
| 40 | | 0.2 | 0.2 | | 0.6 | | | | 1.0 | | | |
| 41 | | 0.2 | 0.2 | | | 0.5 | | | 0.9 | | | |

TABLE 2-continued

| | | | | | | |
|---|---|---|---|---|---|---|
| 42 | | 0.2 | 0.2 | | 0.5 | 0.9 |
| 43 | | 0.2 | 0.2 | | 0.5 | 0.9 |

| Example | Crystal grain size (μm) | Average film thickness of copper oxide (μm) | Diameter of wire (μm) | HAST | FAB shape | Crushed shape | Wedge bondability |
|---|---|---|---|---|---|---|---|
| 23 | 2.6 | 0.003 | 20 | ◯ | ◎ | Δ | ◎ |
| 24 | 1.0 | 0.006 | 20 | ◎ | ◎ | ◯ | ◎ |
| 25 | 1.1 | 0.010 | 20 | ◎ | ◎ | ◯ | ◎ |
| 26 | 1.0 | 0.004 | 20 | ◎ | ◎ | ◯ | ◎ |
| 27 | 1.2 | 0.008 | 20 | ◎ | ◎ | ◯ | ◎ |
| 28 | 1.2 | 0.010 | 20 | ◎ | ◎ | ◯ | ◎ |
| 29 | 1.2 | 0.003 | 20 | ◎ | ◎ | ◯ | ◎ |
| 30 | 1.2 | 0.008 | 20 | ◎ | ◎ | ◯ | ◎ |
| 31 | 1.1 | 0.010 | 20 | ◎ | ◎ | ◯ | ◎ |
| 32 | 1.2 | 0.005 | 20 | ◎ | ◎ | ◯ | ◎ |
| 33 | 1.3 | 0.002 | 20 | ◎ | ◎ | ◯ | ◎ |
| 34 | 1.3 | 0.004 | 20 | ◎ | ◎ | ◯ | ◎ |
| 35 | 1.3 | 0.007 | 20 | ◎ | ◎ | ◯ | ◎ |
| 36 | 1.2 | 0.005 | 20 | ◎ | ◎ | ◯ | ◎ |
| 37 | 1.2 | 0.008 | 20 | ◎ | ◎ | ◯ | ◎ |
| 38 | 1.1 | 0.008 | 20 | ◎ | ◎ | ◯ | ◎ |
| 39 | 1.2 | 0.010 | 20 | ◎ | ◎ | ◯ | ◎ |
| 40 | 1.2 | 0.005 | 20 | ◎ | ◎ | ◯ | ◎ |
| 41 | 1.3 | 0.010 | 20 | ◎ | ◎ | ◯ | ◎ |
| 42 | 1.1 | 0.005 | 20 | ◎ | ◎ | ◯ | ◎ |
| 43 | 1.0 | 0.005 | 20 | ◎ | ◎ | ◯ | ◎ |

TABLE 3

| Example | First element Ni | First element Pt | First element Ir | First element Rh | First element Zn | First element Ga | First element Ge | First element In | First element Total | Second element | Third element Pd |
|---|---|---|---|---|---|---|---|---|---|---|---|
| 44 | 0.7 | | | | | | | | 0.7 | Ti: 0.0001 | |
| 45 | | | | | 3.0 | | | | 3.0 | B: 0.0005 | |
| 46 | | | | | | 0.5 | | | 0.5 | P: 0.005 | |
| 47 | | | | | | | 0.05 | | 0.05 | Mg: 0.01 | |
| 48 | | | | 1.0 | | | | | 1.0 | Ca: 0.03 | |
| 49 | | | | | | | | 0.3 | 0.3 | La: 0.05 | |
| 50 | | | 0.1 | | | | | | 0.1 | As: 0.005 | |
| 51 | | 0.03 | | | | | | | 0.03 | Te: 0.001 | |
| 52 | 0.5 | | | | | | | | 0.5 | Se: 0.0005 | |
| 53 | 0.4 | | | | 0.5 | | | | 0.9 | Ti 0.0001 | |
| 54 | 0.3 | | | | | 0.5 | | | 0.8 | P 0.005 | |
| 55 | 0.3 | | | | | | 0.6 | | 0.9 | B 0.0005 | |
| 56 | 0.3 | | | | | | | 0.5 | 0.8 | Mg 0.01 | |
| 57 | | 0.3 | | | 0.5 | | | | 0.8 | Ca 0.03 | |
| 58 | | 0.4 | | | | 0.5 | | | 0.9 | La 0.05 | |
| 59 | | 0.3 | | | | | 0.5 | | 0.8 | As 0.005 | |
| 60 | | 0.3 | | | | | | 0.4 | 0.7 | Te 0.001 | |
| 61 | 0.2 | 0.2 | | | | 0.5 | | | 0.9 | Se 0.0005 | |
| 62 | | | | | 0.05 | | | | 0.05 | Ti: 0.0005, B: 0.0005 | |
| 63 | | | | | | 0.3 | | | 0.3 | P: 0.005, Mg: 0.005 | |
| 64 | | | | | | | 0.2 | | 0.2 | Ca: 0.025, La: 0.025 | |
| 65 | | | | 1.5 | | | | | 1.5 | As: 0.005, Te: 0.005 | |
| 66 | | | | | | | | 0.5 | 0.5 | Te: 0.001, Se: 0.001 | |

| Example | Crystal grain size (μm) | Average film thickness of copper oxide (μm) | Diameter of wire (μm) | HAST | FAB shape | Crushed shape | Wedge bondability |
|---|---|---|---|---|---|---|---|
| 44 | 0.8 | 0.015 | 20 | ◎ | ◎ | ◎ | ◯ |
| 45 | 1.0 | 0.001 | 20 | ◎ | Δ | ◎ | Δ |
| 46 | 1.1 | 0.002 | 20 | ◎ | ◎ | ◎ | ◎ |

TABLE 3-continued

| Example | Crystal grain size (μm) | Average film thickness of copper oxide (μm) | Diameter of wire (μm) | HAST | FAB shape | Crushed shape | Wedge bondability |
|---|---|---|---|---|---|---|---|
| 47 | 1.2 | 0.004 | 20 | ○ | ⊚ | ⊚ | ⊚ |
| 48 | 1.3 | 0.009 | 20 | ⊚ | ⊚ | ⊚ | ⊚ |
| 49 | 1.0 | 0.009 | 20 | ⊚ | ⊚ | ⊚ | ⊚ |
| 50 | 0.9 | 0.004 | 20 | ⊚ | ⊚ | ○ | ⊚ |
| 51 | 1.2 | 0.013 | 20 | ○ | ⊚ | ⊚ | ⊚ |
| 52 | 1.2 | 0.005 | 20 | ⊚ | ⊚ | ⊚ | ⊚ |
| 53 | 1.1 | 0.008 | 18 | ⊚ | ⊚ | ⊚ | ○ |
| 54 | 1.0 | 0.004 | 18 | ⊚ | ⊚ | ⊚ | ⊚ |
| 55 | 2.6 | 0.009 | 18 | ⊚ | ⊚ | ○ | ⊚ |
| 56 | 0.5 | 0.010 | 18 | ⊚ | ⊚ | ⊚ | ○ |
| 57 | 1.3 | 0.008 | 18 | ⊚ | ⊚ | ⊚ | ⊚ |
| 58 | 1.0 | 0.004 | 18 | ⊚ | ⊚ | ⊚ | ⊚ |
| 59 | 1.0 | 0.003 | 18 | ⊚ | ⊚ | ⊚ | ⊚ |
| 60 | 1.1 | 0.003 | 18 | ⊚ | ⊚ | ⊚ | ⊚ |
| 61 | 1.5 | 0.008 | 18 | ⊚ | ⊚ | ⊚ | ⊚ |
| 62 | 2.7 | 0.008 | 20 | ○ | ⊚ | Δ | ⊚ |
| 63 | 1.5 | 0.004 | 20 | ⊚ | ⊚ | ⊚ | ⊚ |
| 64 | 1.0 | 0.005 | 20 | ⊚ | ⊚ | ⊚ | ⊚ |
| 65 | 1.1 | 0.009 | 20 | ⊚ | ○ | ⊚ | ○ |
| 66 | 0.9 | 0.007 | 20 | ⊚ | ⊚ | ⊚ | ⊚ |

TABLE 4

| Example | Ingredient content(% by mass) | | | | | | | | | Second element | Third element | Pd |
|---|---|---|---|---|---|---|---|---|---|---|---|---|
| | First element | | | | | | | | | | | |
| | Ni | Pt | Ir | Rh | Zn | Ga | Ge | In | Total | | | |
| 67 | 0.5 | | | | | | | | 0.5 | | Ag: 0.0005 | |
| 68 | | | | | 0.05 | | | | 0.05 | | Au: 0.001 | |
| 69 | | | | | | 0.3 | | | 0.3 | | Ag: 0.005 Au: 0.005 | |
| 70 | | | | | | | 0.2 | | 0.2 | | Au: 0.07 | |
| 71 | 0.4 | | | | 0.5 | | | | 0.9 | | Ag 0.01 | |
| 72 | | 0.3 | | | | 0.5 | | | 0.8 | | Ag 0.01 | |
| 73 | 0.3 | | | | | | 0.6 | | 0.9 | | Ag 0.01 | |
| 74 | | 0.4 | | | | | | 0.5 | 0.9 | | Ag 0.01 | |
| 75 | 0.4 | | | | 0.5 | | | | 0.9 | B 0.0005 | Ag 0.01 | |
| 76 | | 0.3 | | | | 0.5 | | | 0.8 | P 0.005 | Ag 0.01 | |
| 77 | | 0.3 | | | 0.5 | | | | 0.8 | | Ag 0.01 | |
| 78 | | | | 0.3 | | 0.5 | | | 0.8 | | Au 0.01 | |
| 79 | | 0.3 | | | | | 0.5 | | 0.8 | | Au 0.01 | |
| 80 | | | 0.3 | | | | | 0.4 | 0.7 | | Au 0.01 | |
| 81 | 0.2 | 0.2 | | | 0.5 | | | | 0.9 | | Au 0.01 | |
| 82 | 0.8 | | | | | | | | 0.8 | | Ag 0.01 | |
| 83 | | 0.7 | | | | | | | 0.7 | | Ag 0.01 | |
| 84 | | | 0.8 | | | | | | 0.8 | Ti 0.0005 B 0.0005 | Ag 0.01 | |
| 85 | | | | 0.8 | | | | | 0.8 | P 0.005 B 0.005 | Ag 0.01 | |
| 86 | | | | | 0.8 | | | | 0.8 | | Ag 0.5 | |
| 87 | | | | | | 0.8 | | | 0.8 | | Ag 0.5 | |
| 88 | | | | | | | 0.7 | | 0.7 | | Au 0.5 | |
| 89 | | | | | | | | 0.8 | 0.8 | | Au 0.5 | |
| 90 | 0.7 | | | | | | | | 0.7 | Ti: 0.0001 | Ag: 0.0005 Au: 0.001 | |
| 91 | | | | | 3.0 | | | | 3.0 | B: 0.0005 | Au: 0.001 | |
| 92 | | | | | | 0.5 | | | 0.5 | P: 0.005 | Ag: 0.005 Au: 0.005 | |

| Example | Crystal grain size (μm) | Average film thickness of copper oxide (μm) | Diameter of wire (μm) | HAST | FAB shape | Crushed shape | Wedge bondability |
|---|---|---|---|---|---|---|---|
| 67 | 1.1 | 0.014 | 20 | ⊚ | ⊚ | ⊚ | ⊚ |
| 68 | 1.2 | 0.003 | 20 | ○ | ⊚ | ⊚ | ⊚ |
| 69 | 1.2 | 0.001 | 20 | ⊚ | ⊚ | ⊚ | ⊚ |
| 70 | 2.3 | 0.0005 | 20 | ⊚ | ⊚ | ○ | ⊚ |
| 71 | 1.2 | 0.006 | 20 | ⊚ | ⊚ | ⊚ | ⊚ |
| 72 | 1.2 | 0.004 | 20 | ⊚ | ⊚ | ⊚ | ⊚ |
| 73 | 1.2 | 0.005 | 20 | ⊚ | ⊚ | ⊚ | ⊚ |
| 74 | 1.2 | 0.010 | 20 | ⊚ | ⊚ | ⊚ | ⊚ |
| 75 | 1.1 | 0.007 | 20 | ⊚ | ⊚ | ⊚ | ⊚ |
| 76 | 1.0 | 0.005 | 20 | ⊚ | ⊚ | ⊚ | ⊚ |
| 77 | 2.8 | 0.008 | 20 | ⊚ | ⊚ | ○ | ⊚ |

TABLE 4-continued

| | | | | | | | |
|---|---|---|---|---|---|---|---|
| 78 | 0.6 | 0.007 | 20 | ⊚ | ⊚ | ⊚ | ○ |
| 79 | 1.3 | 0.001 | 20 | ⊚ | ⊚ | ⊚ | ⊚ |
| 80 | 1.3 | 0.002 | 20 | ⊚ | ⊚ | ⊚ | ⊚ |
| 81 | 1.3 | 0.002 | 20 | ⊚ | ⊚ | ⊚ | ⊚ |
| 82 | 1.2 | 0.005 | 20 | ○ | ⊚ | ⊚ | ⊚ |
| 83 | 1.3 | 0.008 | 20 | ○ | ⊚ | ⊚ | ⊚ |
| 84 | 1.2 | 0.007 | 20 | ○ | ⊚ | ⊚ | ⊚ |
| 85 | 1.0 | 0.003 | 20 | ○ | ⊚ | ⊚ | ⊚ |
| 86 | 1.0 | 0.004 | 20 | ○ | ○ | ⊚ | ⊚ |
| 87 | 1.0 | 0.004 | 20 | ○ | ○ | ⊚ | ⊚ |
| 88 | 1.0 | 0.005 | 20 | ○ | ○ | ⊚ | ⊚ |
| 89 | 1.1 | 0.005 | 20 | ○ | ○ | ⊚ | ⊚ |
| 90 | 1.0 | 0.005 | 20 | ⊚ | ⊚ | ⊚ | ⊚ |
| 91 | 1.1 | 0.009 | 20 | ⊚ | △ | ⊚ | ⊚ |
| 92 | 0.9 | 0.007 | 20 | ⊚ | ⊚ | ⊚ | ⊚ |

TABLE 5

| | Ingredient content (% by mass) | | | | | | | | | | |
|---|---|---|---|---|---|---|---|---|---|---|---|
| | First element | | | | | | | | Second | Third | |
| Example | Ni | Pt | Ir | Rh | Zn | Ga | Ge | In | Total | element | element | Pd |
| 93 | | | | 1.5 | | | | | 1.5 | | | 0.1 |
| 94 | | | | | | | | 0.5 | 0.5 | | | 0.5 |
| 95 | | | 2.0 | | | | | | 2.0 | | | 0.7 |
| 96 | | 0.03 | | | | | | | 0.03 | | | 1.15 |
| 98 | | | | | | 0.05 | | | 0.05 | Mg: 0.01 | | 0.1 |
| 99 | | | | 1.0 | | | | | 1.0 | Ca: 0.03 | | 0.5 |
| 100 | 0.05 | | | | | | | | 0.05 | | | 0.5 |
| 101 | | 0.06 | | | | | | | 0.06 | | | 0.5 |
| 102 | | | | | | 0.06 | | | 0.06 | | | 0.5 |
| 103 | | | | | | | 0.06 | | 0.06 | | | 0.4 |

| | Crystal grain size (μm) | Average film thickness of copper oxide (μm) | Diameter of wire (μm) | Evaluation result | | | |
|---|---|---|---|---|---|---|---|
| Example | | | | HAST | FAB shape | Crushed shape | Wedge bondability |
| 93 | 1.1 | 0.0008 | 20 | ⊚ | ○ | ○ | ○ |
| 94 | 1.2 | 0.001 | 20 | ⊚ | ⊚ | ○ | ⊚ |
| 95 | 1.1 | 0.004 | 20 | ⊚ | △ | ○ | △ |
| 96 | 1.0 | 0.008 | 20 | ⊚ | ⊚ | ○ | ⊚ |
| 98 | 1.1 | 0.014 | 20 | △ | ⊚ | ⊚ | ⊚ |
| 99 | 1.2 | 0.003 | 20 | ⊚ | ⊚ | ⊚ | ⊚ |
| 100 | 1.2 | 0.003 | 20 | ○ | ⊚ | ○ | ⊚ |
| 101 | 1.2 | 0.014 | 20 | ○ | ⊚ | ○ | ⊚ |
| 102 | 1.2 | 0.009 | 20 | ○ | ⊚ | ○ | ⊚ |
| 103 | 1.1 | 0.006 | 20 | ○ | ⊚ | ○ | ⊚ |

TABLE 6

| | Ingredient content (% by mass) | | | | | | | | | | |
|---|---|---|---|---|---|---|---|---|---|---|---|
| Comparative | First element | | | | | | | | Second | Third | |
| Example | Ni | Pt | Ir | Rh | Zn | Ga | Ge | In | Total | element | element | Pd |
| 1 | 3.1 | | | | | | | | 3.1 | | | |
| 2 | | 2.0 | | | 2.0 | | | | 4.0 | | | |
| 3 | | | 0.02 | | | | | | 0.02 | | | |
| 4 | | | | 0.01 | | 0.01 | | | 0.02 | | | |
| 5 | | | | | | | 3.1 | | 3.1 | | | |
| 6 | | | | | | | | 4.0 | 4.0 | | | |

| | Crystal grain size (μm) | Average film thickness of copper oxide (μm) | Diameter of wire (μm) | Evaluation result | | | |
|---|---|---|---|---|---|---|---|
| Comparative Example | | | | HAST | FAB shape | Crushed shape | Wedge bondability |
| 1 | 1.2 | 0.008 | 20 | ○ | X | ○ | X |
| 2 | 1.2 | 0.002 | 20 | ⊚ | X | ○ | X |

TABLE 6-continued

| 3 | 1.1 | 0.010 | 20 | X | ◎ | ○ | ◎ |
| 4 | 1.2 | 0.008 | 20 | X | ◎ | ○ | ◎ |
| 5 | 1.1 | 0.010 | 20 | ◎ | X | ○ | X |
| 6 | 1.3 | 0.008 | 20 | ◎ | X | ○ | X |

(Evaluation Result)

As shown in Tables 1 and 2, in the copper alloy bonding wires in Examples 1 to 103 in which the concentration of the first element is in total 0.03 to 3.0% by mass, it has been confirmed that bonding reliability of the ball bonded part is achieved in the HAST test under the high-temperature and high-humidity environment with temperature of 130° C. and relative humidity of 85%.

In all of the bonding wires in Examples 1 to 103 in which the average film thickness of copper oxide on the wire surface is in the range of 0.0005 to 0.02 μm, the HAST evaluation result is satisfactory.

Of the bonding wires in Examples, in the bonding wires in Examples 1 to 5, 7 to 9, 12 to 22, 24 to 54, 57 to 61, 63 to 69, 71 to 76, and 78 to 103 in which the area reduction ratio in wire drawing is 10% or more in at least half of all the dies and the heat treatment temperature in heat treatment after wire drawing is 600° C. or lower, the average crystal grain size (μm) in core cross section in the direction vertical to the wire axis of the bonding wire is in the range of 0.02×R+0.4 or more to 0.1×R+0.5 or less (where R is the wire diameter (μm)). Here, when the evaluation results of Examples 7 to 14 with the first element content of 0.8 to 1.0% by mass are compared, the wedge bondability and the crushed shape of the ball bond are better in the bonding wire with the average crystal grain size within the range above (Examples 7 to 9, Examples 12 to 14) than in the bonding wire with the average crystal grain size outside the range above (Examples 10 and 11). This result indicates that when the average crystal grain size (μm) in core cross section in the direction vertical to the wire axis of the bonding wire is in the range of 0.02×R+0.4 or more to 0.1×R+0.5 or less (where R is the wire diameter (μm)), the wedge bondability and the crushed shape of the ball bond are satisfactory.

In Example 11, since the heat treatment temperature is low, 300° C. or lower, the average crystal grain size is smaller than the lower limit of the preferable range, and the wedge bondability is " triangle" and slightly worse.

In Example 10, since the heat treatment temperature is high, 700° C. or higher, the average crystal grain size exceeds the upper limit of the preferable range. Consequently, in Example 10, the crushed shape is "triangle" and slightly worse.

In the bonding wires in Examples 24 to 43 including two or more first elements, the result of HAST test is more satisfactory than in the bonding wires in Examples 7 to 14 including a single first element with the equivalent content. This result indicates that in the bonding wire including two or more first elements, the ball bond reliability is even more satisfactory in the HAST test under the high-temperature and high-humidity environment with temperature of 130° C. and relative humidity of 85%.

Of the bonding wires in Examples, in the bonding wires in Examples 44 to 66 further including 0.0001 to 0.050% by mass of each of the second elements, the crushed shape of the ball bonded part is satisfactory.

Of the bonding wires in Examples, in the bonding wires in Examples 67 to 92 including in total 0.0005 to 0.5% by mass of at least one or more kinds of elements (third element) selected from Ag and Au, the crushed shape of the ball bonded part is satisfactory.

Of the bonding wires in Examples, in the bonding wires in Examples 93 to 103 further including 1.15% by mass or less of Pd, it has been confirmed that the bonding reliability of the ball bonded part is even more satisfactory in the HAST test under the high-temperature and high-humidity environment with temperature of 130° C. and relative humidity of 85%.

Of the bonding wires in Examples, in the bonding wires in Examples 75, 76, 84, 85, and 90 to 92 including 0.0001 to 0.050% by mass of each of the second elements and in total 0.0005 to 0.07% by mass of at least one or more kinds of elements (third element) selected from Ag and Au, in addition to the first element, all of the HAST evaluation results, the wedge bondability, and the crushed shape of the ball bonded part are satisfactory. Among others, in Examples 75 and 76 including two or more first elements, the HAST evaluation result is particularly good.

Of the bonding wires in Examples, in the bonding wires in Examples 98 to 99 further including 0.0001 to 0.050% by mass of each of the second elements and 1.15% by mass or less of Pd, in addition to the first element, the HAST evaluation result is even more satisfactory, and the FAB shape, the wedge bondability, and the crushed shape of the ball bonded part are satisfactory.

On the other hand, of the bonding wires in Comparative Examples, in the bonding wires in Comparative Examples 3 and 4 in which the total concentration of the first element is less than 0.03% by mass, bonding reliability of the ball bonded part is not achieved in the HAST test, and in the bonding wires in Comparative Examples 1, 2, 5, and 6 in which the total concentration of the first element is greater than 3% by mass, the FAB shape and the wedge bondability are bad.

The invention claimed is:

1. A copper alloy bonding wire for semiconductor devices, consisting of:
   one or more kinds of first elements selected from Ga, In, and Ir, wherein the total content of the first elements is 0.05% by mass or more and 3% by mass or less; and 0.0005% by mass or more and 0.5% by mass or less of at least one or more kinds of third elements selected from Ag and Au, with respect to the entire wire, with the balance consisting of Cu and inevitable impurities,
   wherein a total content of the first elements and the third elements is more than 0.1% by mass,
   wherein the copper alloy bonding wire does not have a coating layer based on a metal other than copper, and
   wherein an average crystal grain size (μm) in core cross section in a direction perpendicular to a wire axis of the copper alloy bonding wire is $$0.02 \times R + 0.4 \text{ or more} \tag{1a}$$

$$0.1 \times R + 0.5 \text{ or less} \tag{1b}$$

where R (μm) is a diameter of the wire.

2. The copper alloy bonding wire for semiconductor devices according to claim 1, wherein the third elements comprise Ag.

3. The copper alloy bonding wire for semiconductor devices according to claim 1, wherein the one or more kinds of first elements is selected from Ga and Ir.

* * * * *